US012652828B2

(12) United States Patent
Fung

(10) Patent No.: US 12,652,828 B2
(45) Date of Patent: Jun. 9, 2026

(54) STRUCTURE AND FORMATION METHOD OF SEMICONDUCTOR DEVICE WITH EPITAXIAL STRUCTURES

(71) Applicant: Taiwan Semiconductor Manufacturing Company, Ltd., Hsinchu (TW)

(72) Inventor: Ka-Hing Fung, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 850 days.

(21) Appl. No.: 17/569,057

(22) Filed: Jan. 5, 2022

(65) Prior Publication Data

US 2023/0155035 A1      May 18, 2023

Related U.S. Application Data

(60) Provisional application No. 63/279,372, filed on Nov. 15, 2021.

(51) Int. Cl.
| | |
|---|---|
| *H10D 64/01* | (2025.01) |
| *H10D 30/01* | (2025.01) |
| *H10D 30/67* | (2025.01) |
| *H10D 62/10* | (2025.01) |
| *H10P 14/20* | (2026.01) |

(52) U.S. Cl.
CPC ....... *H10D 30/6757* (2025.01); *H10D 30/031* (2025.01); *H10D 30/6713* (2025.01); *H10D 30/6735* (2025.01); *H10D 62/118* (2025.01);

*H10D 64/017* (2025.01); *H10D 64/018* (2025.01); *H10P 14/3452* (2026.01)

(58) Field of Classification Search
CPC ......................... H01L 29/66553; H10D 64/018
USPC .......................................................... 438/151
See application file for complete search history.

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,209,247 | B2 | 12/2015 | Colinge et al. |
| 9,236,267 | B2 | 1/2016 | De et al. |
| 9,245,805 | B2 | 1/2016 | Yeh et al. |
| 9,412,817 | B2 | 8/2016 | Yang et al. |
| 9,412,828 | B2 | 8/2016 | Ching et al. |

(Continued)

*Primary Examiner* — Hsin Yi Hsieh
(74) *Attorney, Agent, or Firm* — Birch, Stewart, Kolasch & Birch, LLP

(57)      ABSTRACT

A semiconductor device structure and a method for forming a semiconductor device structure are provided. The semiconductor device structure includes a stack of channel structures over a semiconductor substrate and a gate stack wrapped around the channel structures. The semiconductor device structure also includes a source/drain epitaxial structure adjacent to the channel structures and multiple inner spacers. Each of the inner spacers is between the gate stack and the source/drain epitaxial structure. The semiconductor device structure further includes multiple epitaxial structures separating the inner spacers from the source/drain epitaxial structure.

20 Claims, 12 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0266060 A1* | 8/2020 | Cheng | H10D 62/116 |
| 2021/0066477 A1* | 3/2021 | Lee | H10D 62/151 |
| 2021/0135011 A1* | 5/2021 | Ju | H01L 21/31155 |
| 2021/0328020 A1* | 10/2021 | Chung | H01L 29/7848 |

* cited by examiner

STRUCTURE AND FORMATION METHOD OF SEMICONDUCTOR DEVICE WITH EPITAXIAL STRUCTURES

PRIORITY CLAIM AND CROSS-REFERENCE

This Application claims the benefit of U.S. Provisional Application No. 63/279,372, filed on Nov. 15, 2021, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
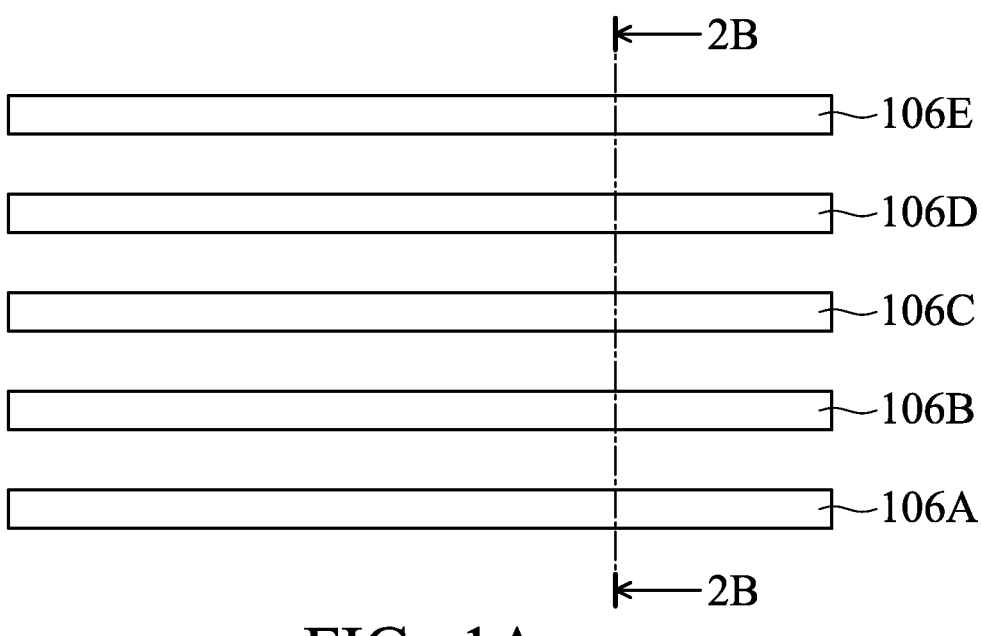
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to $10°$ in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x ±5 or 10% in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
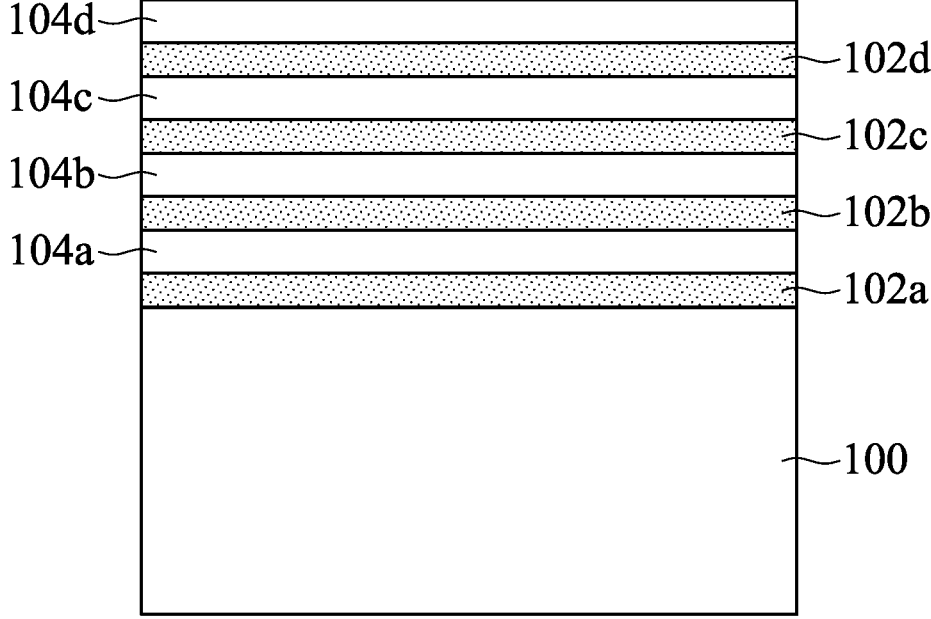
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d. The semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon, germanium, other suitable materials, or a combination thereof. In some embodiments, the semiconductor layers 102a-102d are made of or include silicon germanium. In some other embodiments, the semiconductor layers 104a-104d are made of silicon germanium, and the semiconductor layers 102a-102d are made of silicon germanium with different atomic concentration of germanium than that of the semiconductor layers 104a-104s. As a result, different etching selectivity and/or different oxidation rates during subsequent processing may be achieved between the semiconductor layers 102a-102d and the semiconductor layers 104a-104d.

The present disclosure contemplates that the semiconductor layers 102a-102d and the semiconductor layers 104a-104d include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. One or more photolithography processes and one or more etching processes are used to pattern the semiconductor stack into fin structures 106A, 106B, 106C, 106D, and 106E, as shown in FIG. 2B in accordance with some embodiments.

The fin structures 106A-106E may be patterned by any suitable method. For example, the fin structures 106A-106E may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
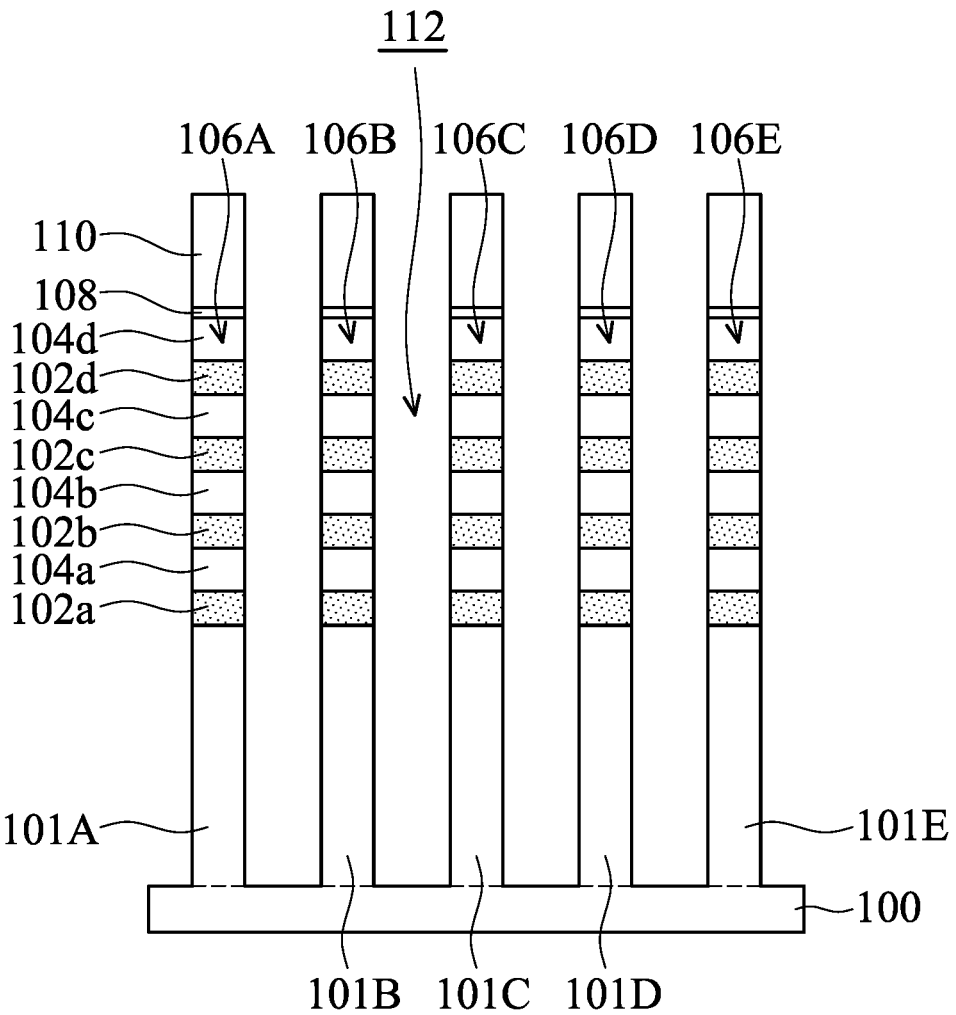

The semiconductor stack is partially removed to form trenches 112, as shown in FIG. 2B. Each of the fin structures 106A-106E may include portions of the semiconductor layers 102a-102d and 104a-104d and semiconductor fins 101A, 101B, 101C, 101D, and 101E. The semiconductor substrate 100 may also be partially removed during the etching process that forms the fin structures 106A-106E.

Protruding portions of the semiconductor substrate 100 that remain form the semiconductor fins 101A-101E.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104*d*. The first mask layer 108 may be made of silicon oxide, germanium oxide, silicon germanium oxide, one or more other suitable materials, or a combination thereof. The second layer 110 may be made of silicon nitride, silicon oxynitride, silicon carbide, one or more other suitable materials, or a combination thereof.

Figure 1B:
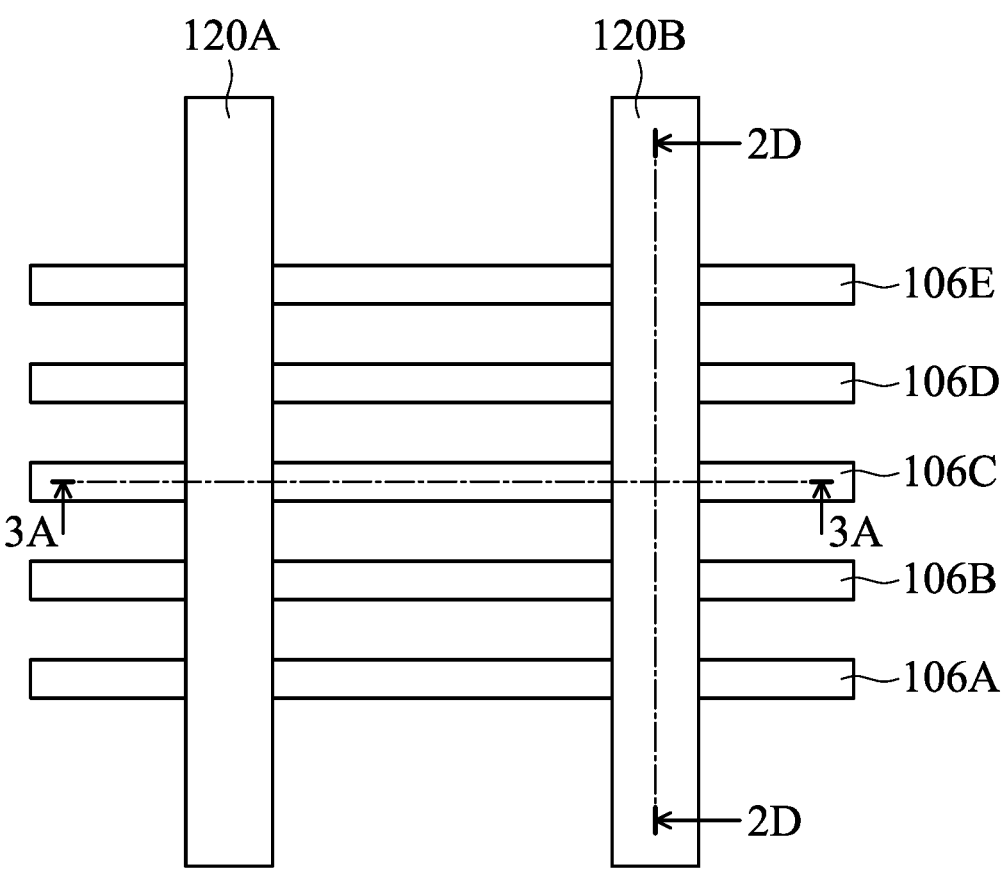

FIGS. 1A-1B are top views of various stages of a process for forming a portion of a semiconductor device structure, in accordance with some embodiments. In some embodiments, the fin structures 106A-106E are oriented lengthwise. In some embodiments, the longitudinal extending directions of the fin structures 106A-106E are substantially parallel to each other, as shown in FIG. 1A. In some embodiments, FIG. 2B is a cross-sectional view of the structure taken along the line 2B-2B in FIG. 1A.

Figure 2C:
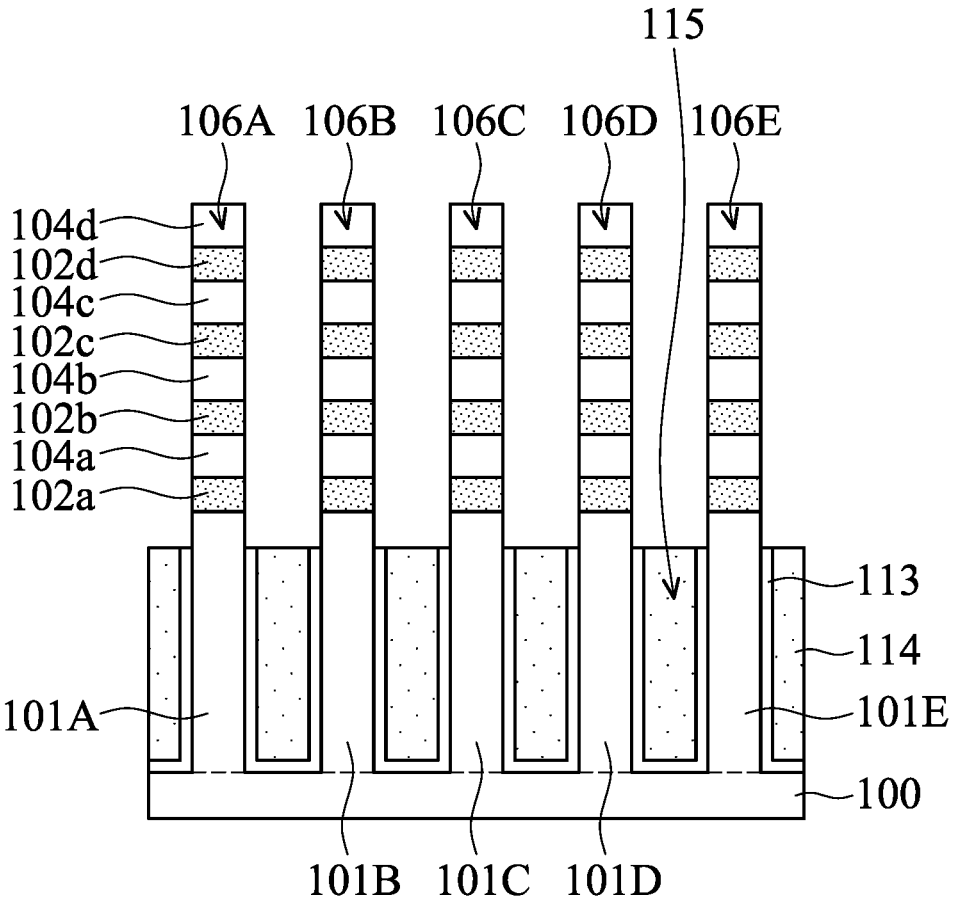

As shown in FIG. 2C, an isolation structure 115 is formed to surround lower portions of the fin structures 106A-106E, in accordance with some embodiments. In some embodiments, the isolation structure 115 includes a dielectric filling 114 and a liner layer 113 that is adjacent to the semiconductor fins 101A-101E. In some embodiments, the semiconductor fins 101A-101E protrude from the top surface of the isolation structure 115.

In some embodiments, one or more dielectric layers are deposited over the fin structures 106A-106E and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as stop layers of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers and the liner layer 113. As a result, the remaining portion of the dielectric layers forms the dielectric filling 114 of the isolation structure 115. Upper portions of the fin structures 106A-106E protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C.

In some embodiments, the topmost surface of the isolation structure 115 is below the bottommost surface of the semiconductor layer 102*a* which functions as a sacrificial layer.

Afterwards, the remaining portions of the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
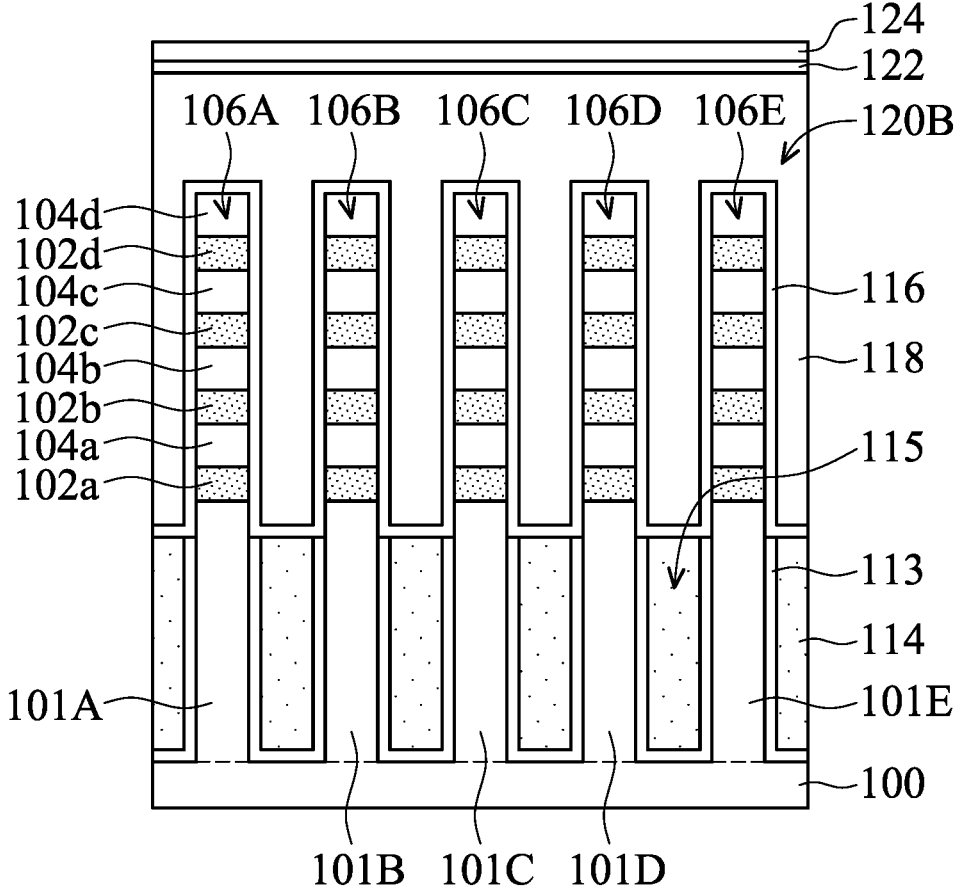

Afterwards, dummy gate stacks 120A and 120B are formed to extend across the fin structures 106A-106E, as shown in FIG. 1B in accordance with some embodiments. In some embodiments, FIG. 2D is a cross-sectional view of the structure taken along the line 2D-2D in FIG. 1B. FIGS. 3A-3M are cross-sectional views of various stages of a process for forming a portion of a semiconductor device structure, in accordance with some embodiments. In some embodiments, FIG. 3A is a cross-sectional view of the structure taken along the line 3A-3A in FIG. 1B.

Figure 3B:
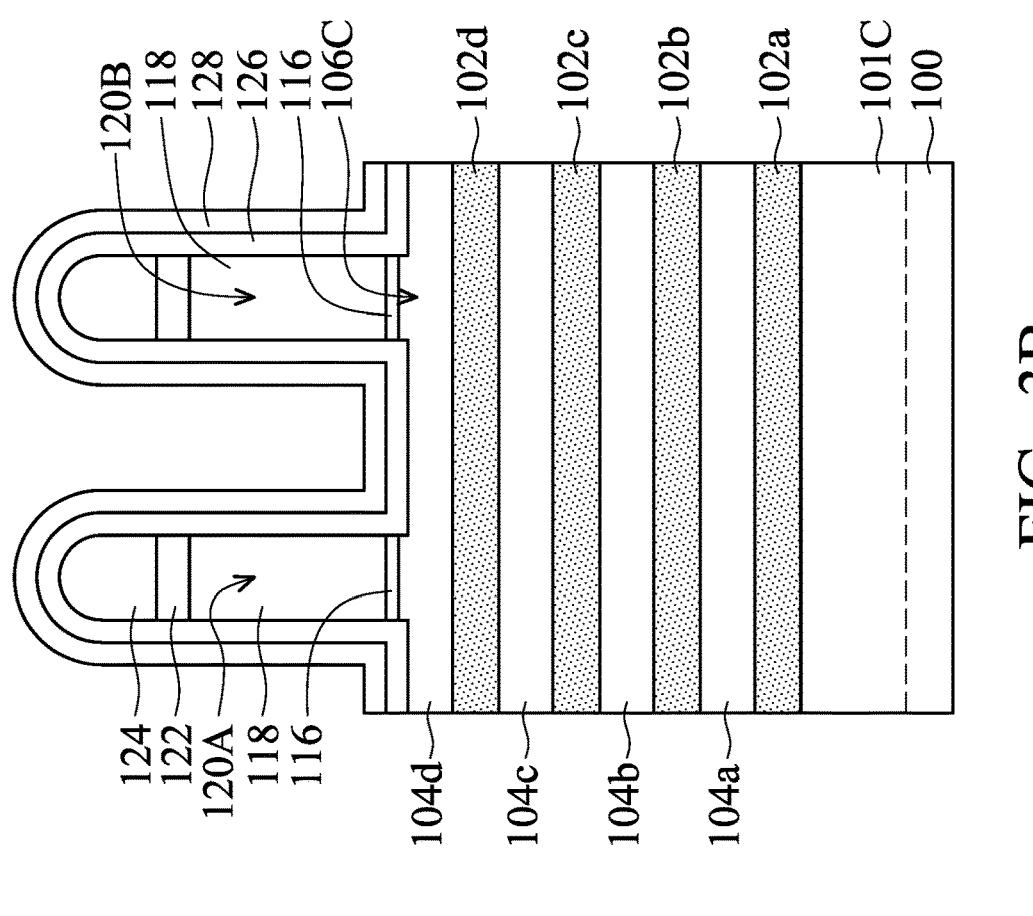
FIGS. 3A-3M are cross-sectional views of various stages of a process for forming a portion of a semiconductor device structure, in accordance with some embodiments.
Figure 3A:
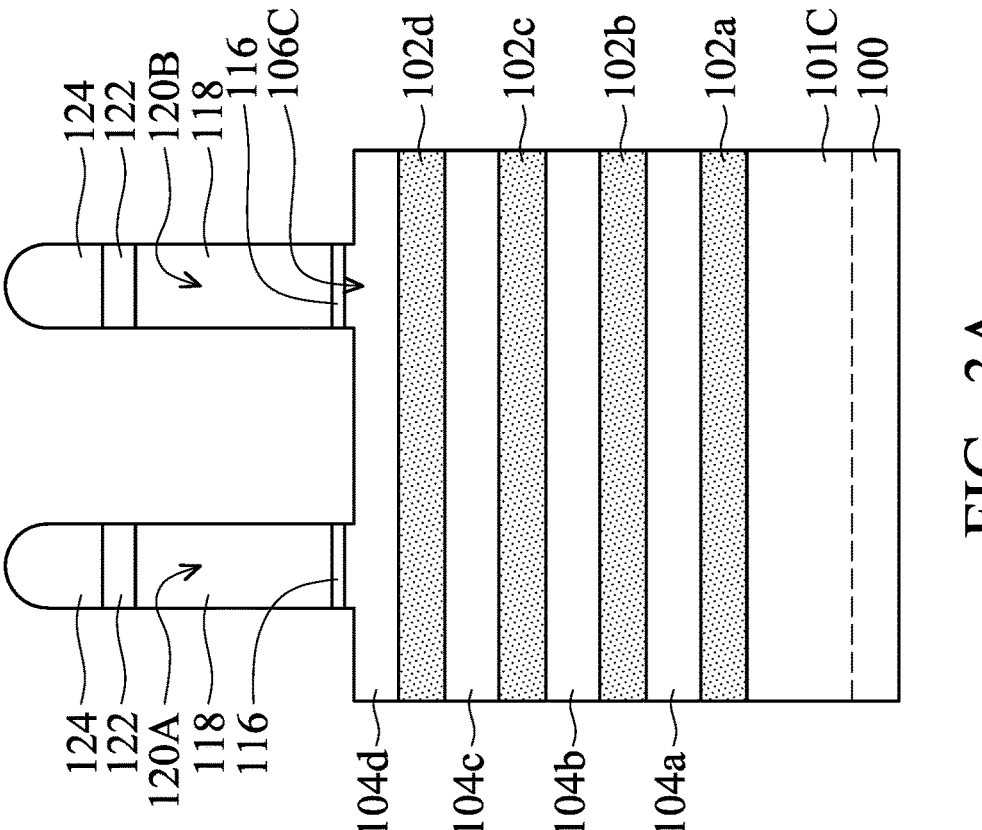

As shown in FIGS. 1B, 2D, and 3A, the dummy gate stacks 120A and 120B are formed to partially cover and to extend across the fin structures 106A-106E, in accordance with some embodiments. In some embodiments, the dummy gate stacks 120A and 120B are wrapped around portions of the fin structures 106A-106E. As shown in FIG. 2D, the dummy gate stack 120B extends across and is wrapped around the fin structures 106A-106E. As shown in FIG. 1B, other portions of the fin structures 106A-106E are exposed without being covered by the dummy gate stack 120A or 120B.

As shown in FIGS. 2D and 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A-106E. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, the portions of the dummy gate dielectric material layer and the dummy gate electrode layer that remain form the dummy gate stacks 120A and 120B that include the dummy gate dielectric layer 116 and the dummy gate electrodes 118.

As shown in FIG. 3B, spacer layers 126 and 128 are afterwards deposited over the dummy gate stacks 120A and 120B and the fin structure 106C, in accordance with some embodiments. The spacer layers 126 and 128 extend along the tops and sidewalls of the dummy gate stacks 120A and 120B, as shown in FIG. 3B. The spacer layers 126 and 128 extend along the top of the fin structure 106C, as shown in FIG. 3B.

The spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figures 3C, 3D:
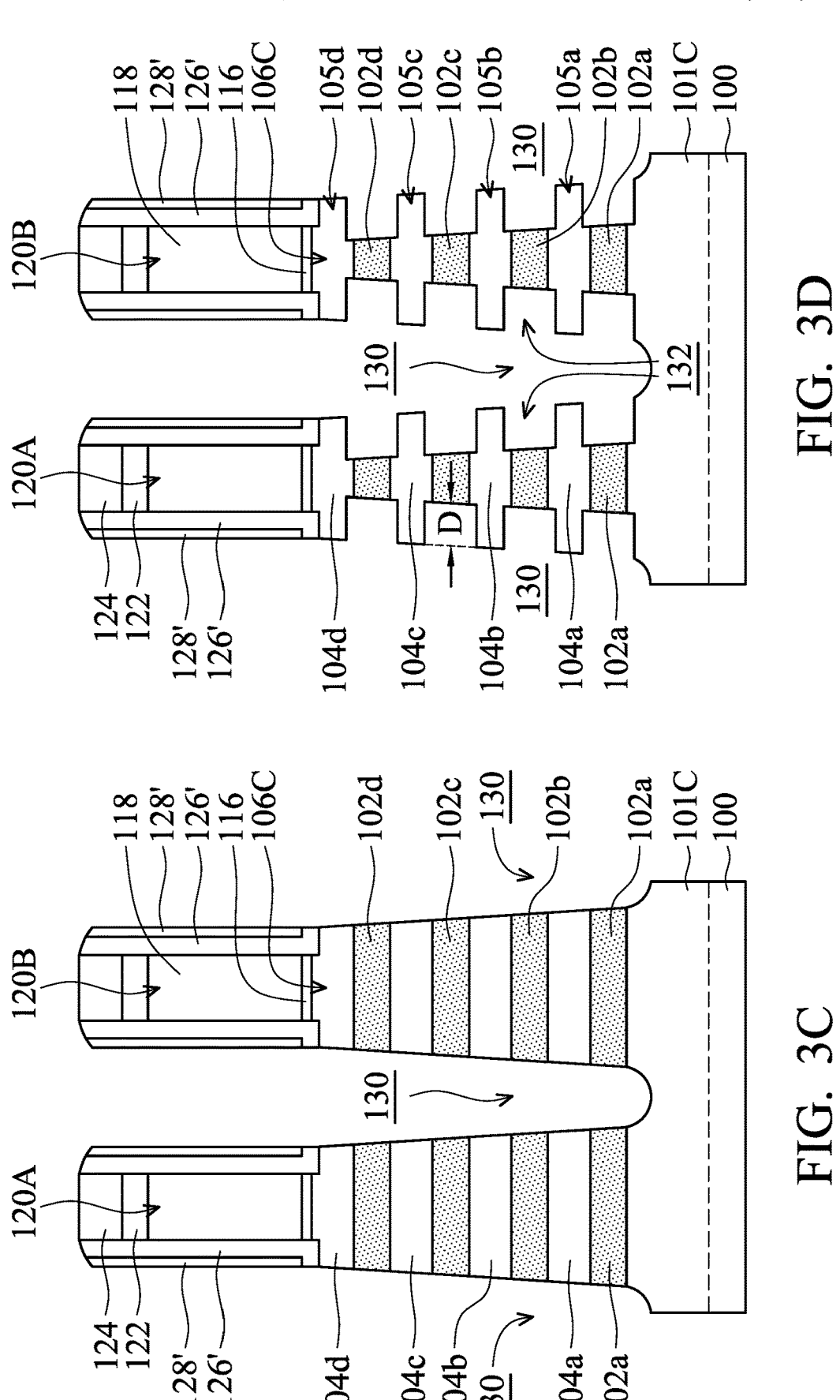

As shown in FIG. 3C, the spacer layers 126 and 128 are partially removed, in accordance with some embodiments. One or more anisotropic etching processes may be used to partially remove the spacer layers 126 and 128. As a result, the portions of the spacer layers 126 and 128 that remain form spacer elements 126' and 128', respectively. The spacer elements 126' and 128' extend along the sidewalls of the dummy gate stacks 120A and 120B, as shown in FIG. 3C.

Afterwards, the fin structures 106A-106E are partially removed to form recesses used for containing subsequently formed epitaxial structures. As shown in FIG. 3C, the fin structure 106C is partially removed to form recesses 130, in accordance with some embodiments. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106C. In some embodiments, the recesses 130 further extend into the semiconductor fin 101C, as shown in FIG. 3C. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 are used to contain inner spacers and semiconductor structures that will be formed later. The laterally etching of the semiconductor layers 102a-102d is carefully controlled to ensure that each of the recesses 132 has a sufficient depth. As shown in FIG. 3D, each of the recesses 132 has a depth D. The depth D may be in a range from about 8 nm to about 15 nm.

The semiconductor layers 102a-102d may be laterally etched using a wet etching process, a dry etching process, or a combination thereof. In some other embodiments, the semiconductor layers 102a-102d are partially oxidized before being laterally etched.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

Figures 3E, 3F:
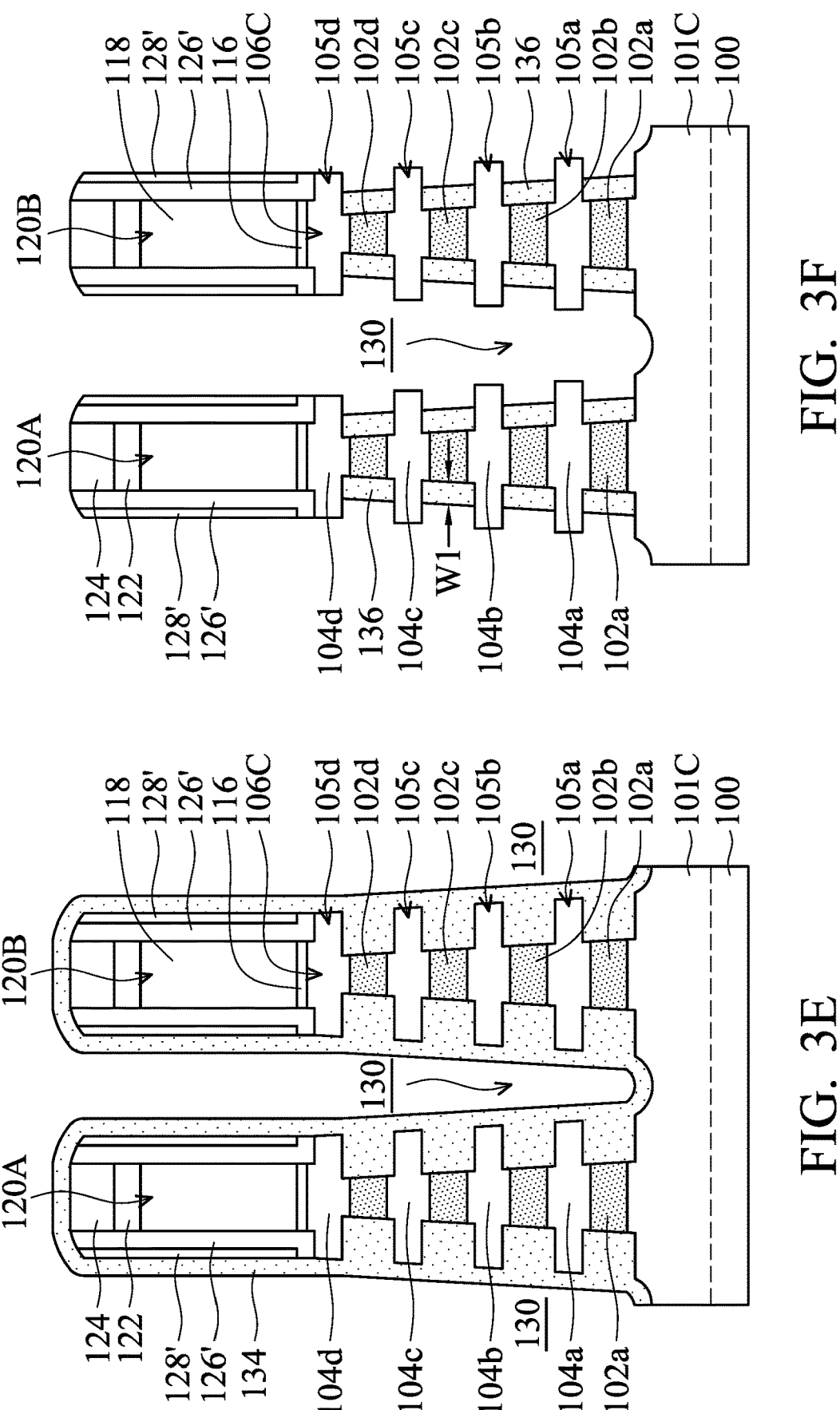

As shown in FIG. 3E, an inner spacer layer 134 is deposited over the structure shown in FIG. 3D, in accordance with some embodiments. The inner spacer layer 134 covers the dummy gate stacks 120A and 120B and fills the recesses 132. The inner spacer layer 134 may be made of or include silicon oxide, carbon-containing silicon nitride (SiCN), carbon-containing silicon oxynitride (SiOCN), carbon-containing silicon oxide (SiOC), silicon nitride, one or more other suitable materials, or a combination thereof.

In some embodiments, the inner spacer layer 134 is a single layer. In some other embodiments, the inner spacer layer 134 includes multiple sub-layers. Some of the sub-layers may be made of different materials and/or contain different compositions. The inner spacer layer 134 may be deposited using an ALD process, a plasma-enhanced atomic layer deposition (PEALD) process, a CVD process, one or more other applicable processes, or a combination thereof.

As shown in FIG. 3F, an etching process is used to partially remove the inner spacer layer 134, in accordance with some embodiments. The portions of the inner spacer layer 134 outside of the recesses 132 are removed, and the portions of the inner spacer layer 134 inside of the recesses 132 are partially removed. As a result, the remaining portions of the inner spacer layer 134 form inner spacers 136, as shown in FIG. 3F. The etching process may include a dry etching process, a wet etching process, or a combination thereof. As shown in FIG. 3F, each of the inner spacers 136 has a width W1. The width W1 may be in a range from about 4 nm to about 8 nm.

The inner spacers 136 cover the edges of the semiconductor layers 102a-102d. The inner spacers 136 may be used to prevent subsequently formed source/drain structures from being damaged during subsequent processes. The inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101C originally covered by the inner spacer layer 134 are exposed by the recesses 130, as shown in FIG. 3F. The edge portions 105a-105d of the semiconductor layers 104a-104d are also exposed, as shown in FIG. 3F.

Figures 3G, 3H:
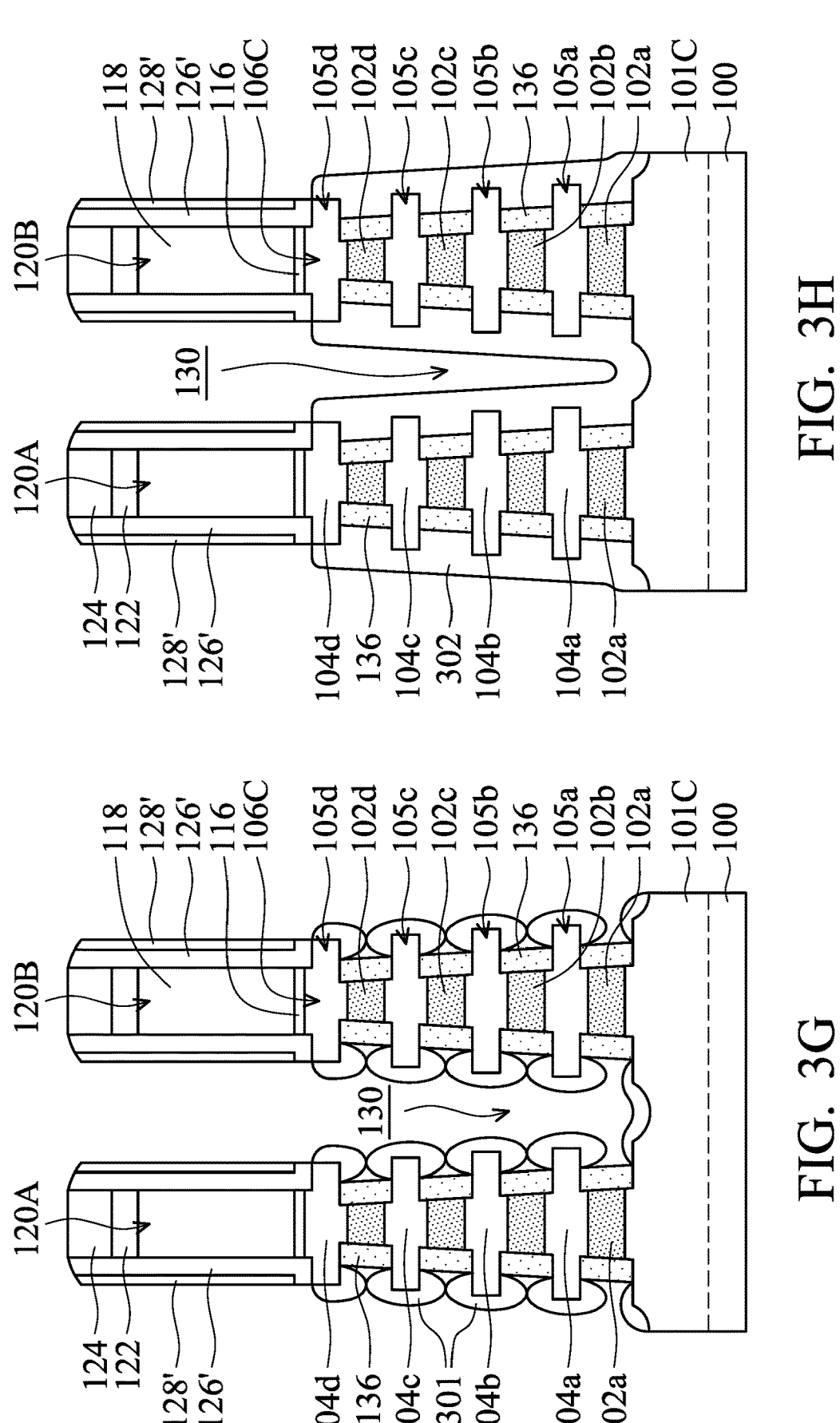

As shown in FIG. 3G, semiconductor materials 301 are epitaxially grown on the exposed surfaces of the semiconductor layers 104a-104d, in accordance with some embodiments. In some embodiments, as the growing of the semiconductor materials 301, the semiconductor materials 301 become larger, as shown in FIG. 3G. As a result, the semiconductor materials 301 that are nearby are in direct contact with each other. The semiconductor materials 301 are thus merged together.

In some embodiments, the semiconductor materials 301 are made of single crystal semiconductor material, such as single crystal silicon. In some embodiments, the compositions and/or the crystal orientations of the semiconductor materials 301 and the semiconductor layers 104a-104d are substantially the same. In some embodiments, the semiconductor materials 301 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

As shown in FIG. 3H, after the continuous growing of the semiconductor materials 301, the semiconductor materials 301 are merged to form an epitaxial layer 302, in accordance with some embodiments. In some embodiments, the compositions and/or the crystal orientations of the epitaxial layer 302 and the semiconductor layers 104a-104d are substantially the same.

Figures 3I, 3J:
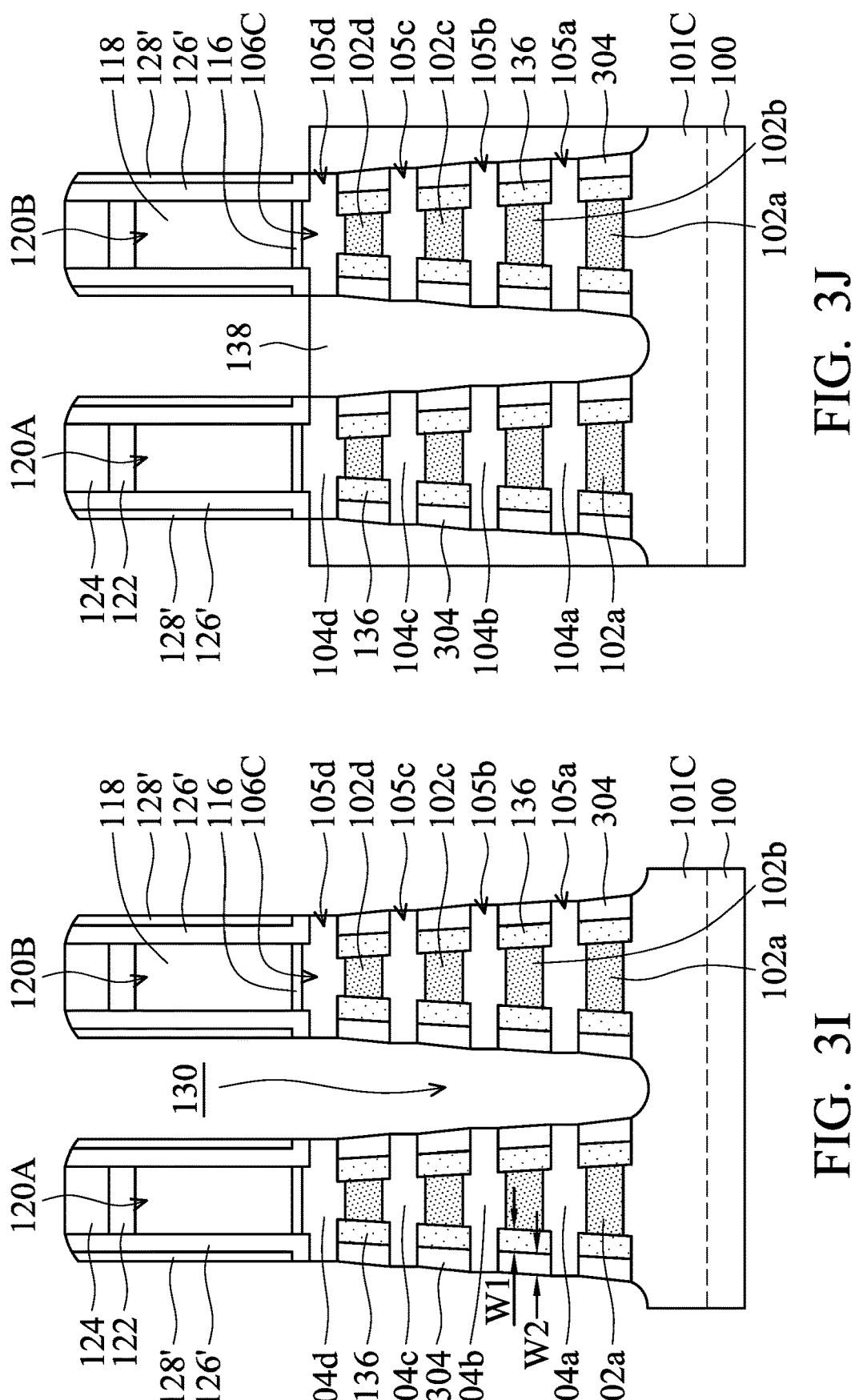

Afterwards, the epitaxial layer 302 is partially removed, in accordance with some embodiments. In some embodiments, the portion of the epitaxial layer 302 outside of the recesses 132 is removed. As a result, the remaining portions of the epitaxial layer 302 form multiple epitaxial structures 304, as shown in FIG. 3I in accordance with some embodiments. As shown in FIG. 3I, each of the epitaxial structures 304 has a width W2. The width W2 may be in a range from about 4 nm to about 8 nm. The partial removal of the epitaxial layer 302 may be achieved using one or more etching processes.

In some embodiments, the compositions and/or the crystal orientations of the epitaxial structures 304 and the semiconductor layers 104a-104d are substantially the same. In some embodiments, the edges of the semiconductor layers 104a-104d are substantially aligned with the edges of the epitaxial structures 304, as shown in FIG. 3I. The edges of the semiconductor layers 104a-104d and the epitaxial structures 304 are vertically aligned with each other. In some embodiments, each of the epitaxial structures 304 is in direct contact with one or two of the semiconductor layers 104a-104d, as shown in FIG. 3I. In some embodiments, the epitaxial structures 304 are in direct contact with the inner spacers 136, as shown in FIG. 3I.

As shown in FIG. 3J, source/drain epitaxial structures 138 are formed in the recesses 130, in accordance with some embodiments. In some embodiments, the source/drain epitaxial structures 138 fill the recesses 130, as shown in FIG. 3J. In some other embodiments, the source/drain epitaxial structures 138 overfill the recesses 130. In these cases, the top surfaces of the source/drain epitaxial structures 138 may be higher than the top surface of the dummy gate dielectric layer 116. In some other embodiments, the source/drain epitaxial structures 138 partially fill the recesses 130.

As mentioned above, in some embodiments, the compositions and/or the crystal orientations of the epitaxial structures 304 and the semiconductor layers 104a-104d are substantially the same. The edges of the semiconductor layers 104a-104d are substantially aligned with the edges of the epitaxial structures 304. The edges of the semiconductor layers 104a-104d and the epitaxial structures 304 together provide a semiconductor surface that has substantially the same crystal orientation and compositions to enable good quality of the source/drain epitaxial structures 138 epitaxially grown thereon. The source/drain epitaxial structures 138 are thus prevented from being grown on the surfaces of the inner spacers 136, which significantly reduces the formation of defects and/or stacking fault in the source/drain epitaxial structures 138. The performance and reliability of the semiconductor device structure are significantly improved.

In some embodiments, the source/drain epitaxial structures 138 connect to the semiconductor layers 104a-104d. Each of the semiconductor layers 104a-104d is sandwiched between two of the source/drain epitaxial structures 138. In some embodiments, the source/drain epitaxial structures 138 are n-type doped regions. The source/drain epitaxial structures 138 may include epitaxially grown silicon, epitaxially grown silicon carbide (SiC), epitaxially grown germanium, or another suitable epitaxially grown semiconductor material.

However, embodiments of the disclosure are not limited thereto. In some other embodiments, the source/drain epitaxial structures 138 are p-type doped regions. The source/drain epitaxial structures 138 may include epitaxially grown silicon germanium (SiGe), epitaxially grown silicon, or another suitable epitaxially grown semiconductor material.

In some embodiments, each of the source/drain epitaxial structures 138 has a first dopant concentration. Each of the epitaxial structures 304 has a second dopant concentration. Each of the semiconductor layers 104a-104d has a third dopant concentration. In some embodiments, the first dopant concentration is greater than the second dopant concentration or the third dopant concentration. In some embodiments, the second dopant concentration is substantially equal to the third dopant concentration. In some embodiments, the second dopant concentration is substantially equal to zero. In some other embodiments, some dopants may diffuse into the epitaxial structures 304 from the nearby source/drain epitaxial structures 138.

In some embodiments, the source/drain epitaxial structures 138 are doped in-situ during their epitaxial growth. The initial reaction gas mixture for forming the source/drain epitaxial structures 138 contains dopants. In some other embodiments, the source/drain epitaxial structures 138 are not doped during the growth of the source/drain epitaxial structures 138. Instead, after the formation of the source/drain epitaxial structures 138, the source/drain epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof.

In some embodiments, the source/drain epitaxial structures 138 are further exposed to one or more annealing processes to activate the dopants. For example, a rapid thermal annealing process is used. However, embodiments of the disclosure are not limited thereto. Many variations and/or modifications can be made to embodiments of the disclosure. In some embodiments, the source/drain epitaxial structures 138 are not thermally annealed at this stage. Therefore, dopants from the source/drain epitaxial structures 138 are prevented from diffusing into the semiconductor layers 104a-104d through the interface between the semiconductor layers 104a-104d and the semiconductor layers 102*a*-102*d*. Dopants are thus prevented from entering the semiconductor layers 104*a*-104*d* that will be used to form channel structures. The performance and reliability of the semiconductor device structure are significantly improved.

Figures 3K, 3L:
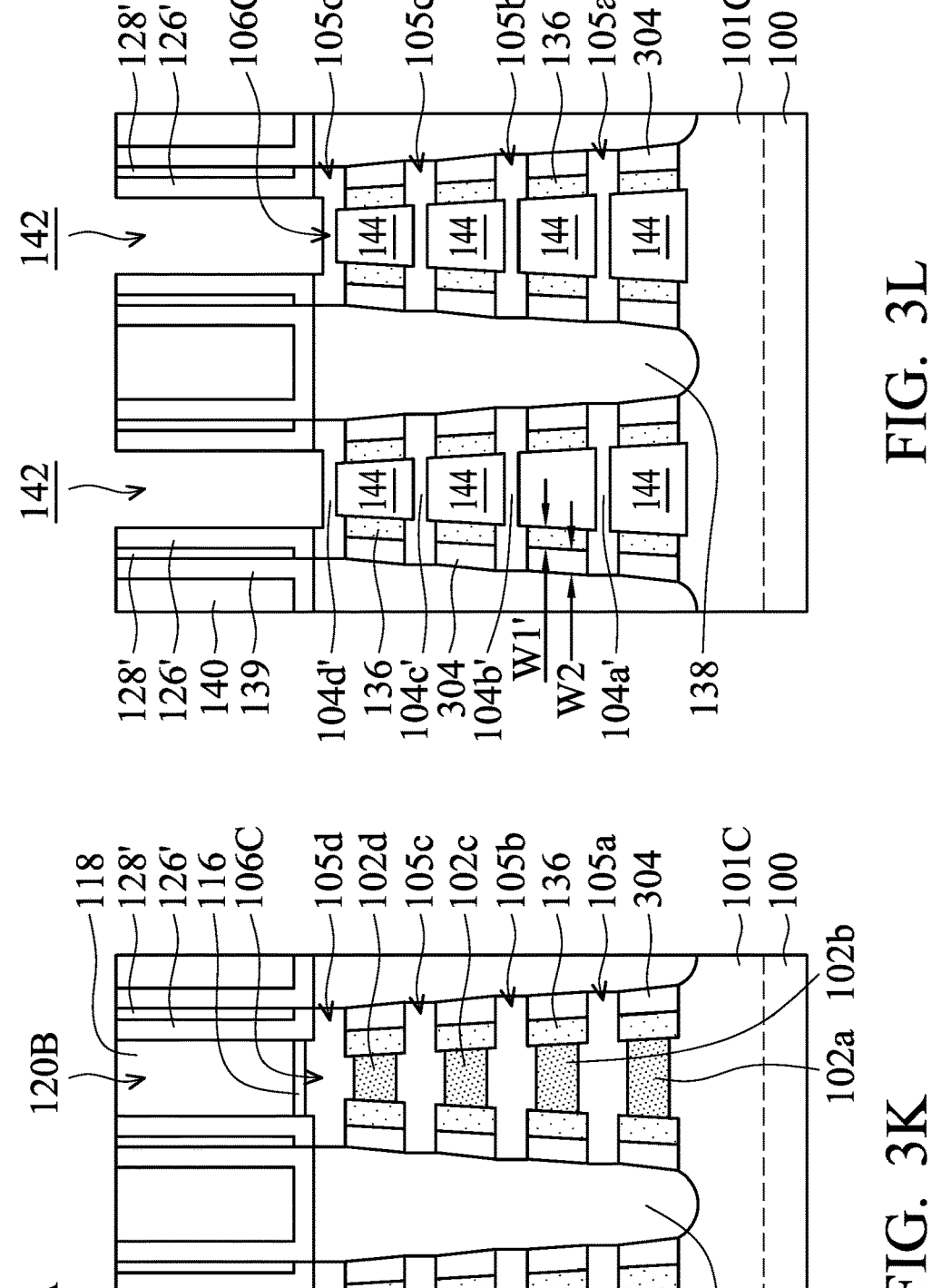

As shown in FIG. 3K, a contact etch stop layer 139 and a dielectric layer 140 are formed to cover the source/drain epitaxial structures 138, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3J. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3K. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level with each other.

As shown in FIG. 3L, the dummy gate electrodes 118 are removed to form trenches 142 using one or more etching processes, in accordance with some embodiments. The trenches 142 are surrounded by the dielectric layer 140. Afterwards, the dummy gate dielectric layer 116 and the semiconductor layers 102*a*-102*d* (which function as sacrificial layers) are removed, as shown in FIG. 3L in accordance with some embodiments. In some embodiments, one or more etching processes are used to remove the dummy gate dielectric layer 116 and the semiconductor layers 102*a*-102*d*. As a result, recesses 144 are formed, as shown in FIG. 3L.

Due to high etching selectivity, the semiconductor layers 104*a*-104*d* are slightly (or substantially not) etched. The remaining portions of the semiconductor layers 104*a*-104*d* form multiple semiconductor nanostructures 104*a'*-104*d'*. The semiconductor nanostructures 104*a'*-104*d'* are constructed by or made up of the remaining portions of the semiconductor layers 104*a*-104*d*. The semiconductor nanostructures 104*a'*-104*d'* suspended over the semiconductor fin 101C may function as channel structures of transistors.

In some embodiments, the etchant used for removing the semiconductor layers 102*a*-102*d* also slightly removes the semiconductor layers 104*a*-104*d* that form the semiconductor nanostructures 104*a'*-104*d'*. As a result, the obtained semiconductor nanostructures 104*a'*-104*d'* become thinner after the removal of the semiconductor layers 102*a*-102*d*. In some embodiments, each of the semiconductor nanostructures 104*a'*-104*d'* is thinner than the edge portions 105*a*-105*d* since the edge portions 105*a*-105*d* are surrounded by other elements and thus are prevented from being reached and etched by the etchant.

In some embodiments, the etchant used for removing the semiconductor layers 102*a*-102*d* also slightly removes the inner spacers 136. As a result, the inner spacers 136 become thinner after the formation of the recesses 144. As shown in FIG. 3L, each of the inner spacers 136 has a width W1'. The width W1' may be in a range from about 3 nm to about 6 nm.

After the removal of the semiconductor layers 102*a*-102*d* (which function as sacrificial layers), the recesses 144 are formed. The recesses 144 connect to the trench 142 and surround each of the semiconductor nanostructures 104*a'*-104*d'*. Even if the recesses 144 between the semiconductor nanostructures 104*a'*-104*d'* are formed, the semiconductor nanostructures 104*a'*-104*d'* remain held by the source/drain epitaxial structures 138. Therefore, after the removal of the semiconductor layers 102*a*-102*d* (which function as sacrificial layers), the released semiconductor nanostructures 104*a'*-104*d'* are prevented from falling.

During the removal of the semiconductor layers 102*a*-102*d* (which function as sacrificial layers), the inner spacers 136 protect the source/drain epitaxial structures 138 from being etched or damaged. The quality and reliability of the semiconductor device structure are improved.

In some embodiments, after the removal of the semiconductor layers 102*a*-102*d*, a thermal annealing process is used to activate the dopants in the source/drain epitaxial structures 138. Since the interface between the semiconductor layers 102*a*-102*d* and 104*a*-104*d* no longer exist after the removal of the semiconductor layers 102*a*-102*d*, dopants from the source/drain epitaxial structures 138 are prevented from diffusing into the semiconductor layers 104*a*-104*d*. Dopants are thus prevented from entering the semiconductor nanostructures 104*a'*-104*d'* that function as the channel structures. The performance and reliability of the semiconductor device structure are significantly improved.

Figures 3M, 4:
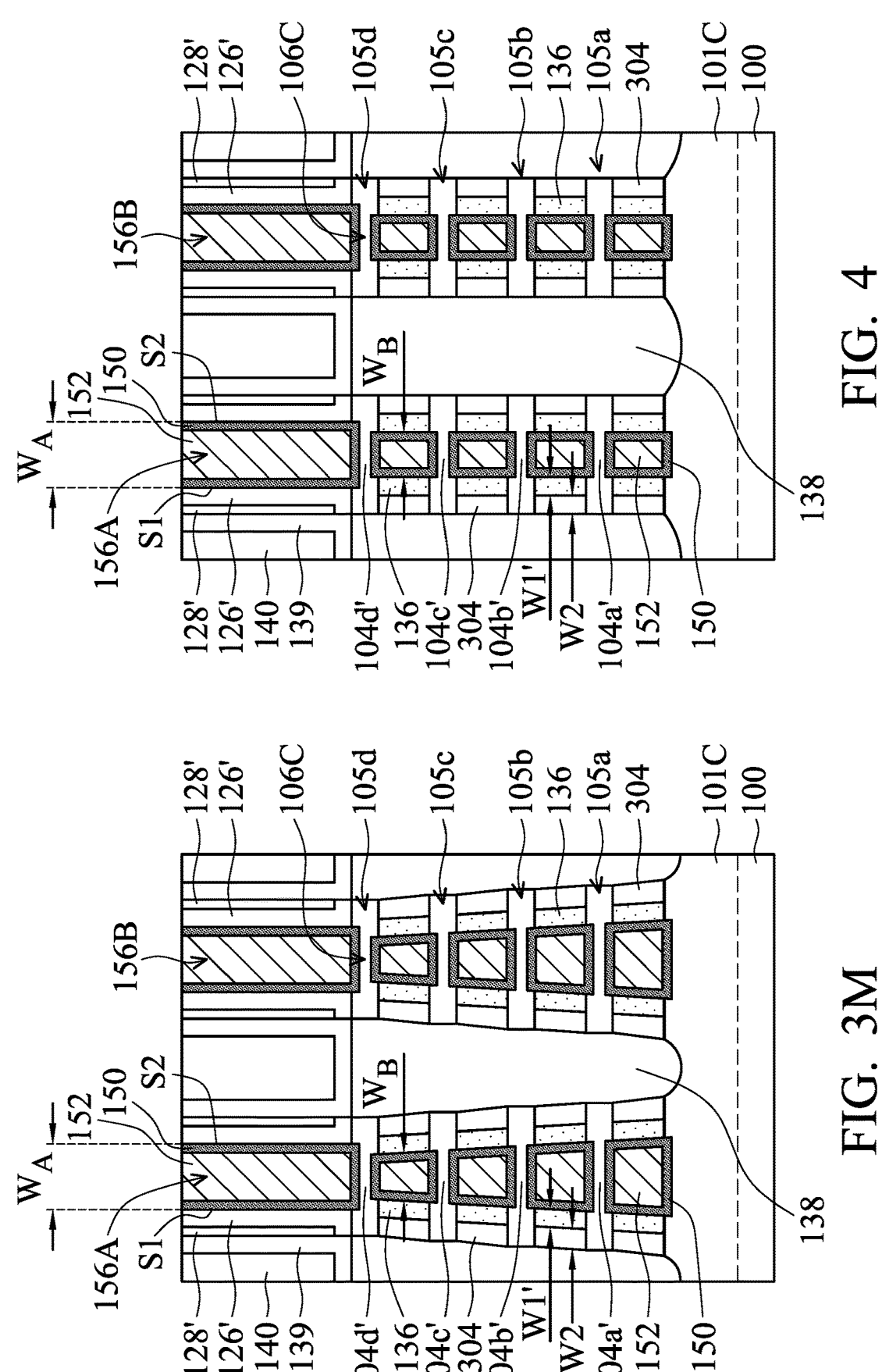
FIG. 4 is a cross-sectional view of an intermediate stage of a process for forming a portion of a semiconductor device structure, in accordance with some embodiments.

As shown in FIG. 3M, metal gate stacks 156A and 156B are formed to fill the trenches 142, in accordance with some embodiments. The metal gate stacks 156A and 156B further extend into the recesses 144 to wrap around each of the semiconductor nanostructures 104*a'*-104*d'*.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104*a'*-104*d'*.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3M.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

In the embodiments illustrated in FIG. 3C, the recesses 130 have slanted sidewalls. Therefore, the source/drain epitaxial structures 138 may thus also have slanted sidewalls, as shown in FIG. 3M. However, embodiments of the disclosure are not limited thereto. Many variations and/or modifications can be made to embodiments of the disclosure.

FIG. 4 is a cross-sectional view of an intermediate stage of a process for forming a portion of a semiconductor device structure, in accordance with some embodiments. In some embodiments, the recesses 130 used for containing the source/drain epitaxial structures have substantially vertical sidewalls. Therefore, the source/drain epitaxial structures 138 may thus also have substantially vertical sidewalls, as shown in FIG. 4.

As shown in FIG. 3M or 4, in some embodiments, the edges of the semiconductor nanostructures 104a'-104d' are substantially aligned with the edges of the epitaxial structures 304. The edges of the semiconductor nanostructures 104a'-104d' and the edges of the epitaxial structures 304 are vertically aligned with each other. In some embodiments, each of the epitaxial structures 304 is in direct contact with one or two of the semiconductor nanostructures 104a'-104d'. As shown in FIG. 3M or 4, the epitaxial structure 304 that are vertically between the semiconductor nanostructures 104a' and 104b' is in direct contact with the semiconductor nanostructures 104a' and 104b'.

As shown in FIG. 3M or 4, in some embodiments, each of the metal gate stacks 156A and 156 has an upper portion over the topmost surface of the semiconductor nanostructure 104d'. As shown in FIG. 3M or 4, the upper portion of the metal gate stack 156A or 156 has opposite sidewalls. In some embodiments, the interface between one of the inner spacers 136 and the metal gate stack 156A or 156B is laterally between the opposite sidewalls of the upper portion of the metal gate stack 156A or 156B, as shown in FIG. 3M or 4.

As shown in FIGS. 3M and 4, the upper portion of the metal gate stacks 156A or 156 has a width $W_A$. Each of the metal gate stacks 156A and 156 also has a lower portion that is below the bottommost surface of the semiconductor nanostructure 104$d'$. The lower portion of the metal gate stacks 156A or 156 has a width $W_B$. In some embodiments, the upper portion with the width $W_A$ is wider than the lower portion with the width $W_B$.

As shown in FIG. 3M or 4, in some embodiments, the interface between the epitaxial structure 304 and the inner spacer 136 is laterally between the interface between the epitaxial structure 304 and the source/drain epitaxial structure 138 and the interface between the inner spacer 136 and the metal gate stack 156A or 156B. As shown in FIGS. 3M and 4, each of the inner spacers 136 has an outer side and an inner side. The outer side is between the inner side and the epitaxial structure 304. In some embodiments, the inner side is laterally between the opposite sidewalls of the upper portion of the metal gate stack 156A or 156B.

Many variations and/or modifications can be made to embodiments of the disclosure. In some embodiments, there are four channel structures (such as the semiconductor nanostructures 104$a'$-104$d'$) formed. However, embodiments of the disclosure are not limited thereto. Many variations and/or modifications can be made to embodiments of the disclosure. In some embodiments, the total number of semiconductor nanostructures is greater than four. In some other embodiments, the total number of semiconductor nanostructures is smaller than four. The total number of semiconductor nanostructures (or channel structures) of each semiconductor device structure may be fine-tuned to meet requirements. For example, the total number of semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with gate-all-around structure. The inner spacers are recessed to expose larger surface of the semiconductor layers used for forming channel structures. Afterwards, epitaxial structures are grown on the exposed surfaces of the semiconductor layers used for forming the channel structures. The edges of the semiconductor layers and the epitaxial structure together provide a semiconductor surface that has substantially the same composition and crystal orientation to enable good quality of source/drain epitaxial structures to be epitaxially grown thereon. The source/drain epitaxial structures are thus prevented from being grown on the surfaces of the inner spacers, which significantly reduces the formation of defects and/or stacking fault in the source/drain epitaxial structures. The performance and reliability of the semiconductor device structure are significantly improved.

In accordance with some embodiments, a semiconductor device structure is provided. The semiconductor device structure includes a stack of channel structures over a semiconductor substrate and a gate stack wrapped around the channel structures. The semiconductor device structure also includes a source/drain epitaxial structure adjacent to the channel structures and multiple inner spacers. Each of the inner spacers is between the gate stack and the source/drain epitaxial structure. The semiconductor device structure further includes multiple epitaxial structures separating the inner spacers from the source/drain epitaxial structure.

In accordance with some embodiments, a semiconductor device structure is provided. The semiconductor device structure includes a channel structure over a semiconductor substrate and a gate stack wrapped around the channel structure. The semiconductor device structure also includes a source/drain epitaxial structure connecting the channel structures and an inner spacer between the gate stack and the source/drain epitaxial structure. The semiconductor device structure further includes an epitaxial structure between the inner spacer and the source/drain epitaxial structure.

In accordance with some embodiments, a method for forming a semiconductor device structure is provided. The method includes forming a fin structure over a semiconductor substrate. The fin structure has multiple sacrificial layers and multiple semiconductor layers, and the sacrificial layers and the semiconductor layers are laid out alternately. The method also includes forming a dummy gate stack to cover a portion of the fin structure and partially removing the fin structure to form a first recess. The method further includes partially removing the sacrificial layers exposed by the first recess to form multiple second recesses partially exposing the semiconductor layers. In addition, the method includes forming multiple inner spacers in the second recesses to cover edges of the sacrificial layers and forming epitaxial structures in the second recesses to cover the inner spacers. The method includes forming a source/drain epitaxial structure in the first recess. The method also includes removing the dummy gate stack and the sacrificial layers to form multiple semiconductor nanostructures made of remaining portions of the semiconductor layers. The method further includes forming a metal gate stack to wrap around the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a fin structure over a semiconductor substrate, wherein the fin structure has a plurality of sacrificial layers and a plurality of semiconductor layers, and the sacrificial layers and the semiconductor layers are laid out alternately;

forming a dummy gate stack to cover a portion of the fin structure;

partially removing the fin structure to form a first recess;

partially removing the sacrificial layers exposed by the first recess to form a plurality of second recesses partially exposing the semiconductor layers;

forming a plurality of inner spacers in the second recesses to cover edges of the sacrificial layers;

epitaxially growing an epitaxial layer on exposed surfaces of the semiconductor layers;

partially removing the epitaxial layer, wherein remaining portions of the epitaxial layer form first epitaxial structures in the second recesses to cover the inner spacers, wherein the first epitaxial structures are interleaved by the semiconductor layers;

forming a second epitaxial structure in the first recess, wherein the second epitaxial structure is spaced apart from the inner spacers by the first epitaxial structures;

removing the dummy gate stack and the sacrificial layers and partially removing the semiconductor layers to form a plurality of semiconductor nanostructures made of remaining portions of the semiconductor layers; and forming a metal gate stack to wrap around the semiconductor nanostructures.

2. The method for forming a semiconductor device structure as claimed in claim 1, further comprising epitaxially growing semiconductor materials on the exposed surfaces of the semiconductor layers, wherein the semiconductor materials are merged to form the epitaxial layer.

3. The method for forming a semiconductor device structure as claimed in claim 1, further comprising:

forming an inner spacer layer to overfill the second recesses; and partially removing the inner spacer layer before the formation of the first epitaxial structures, wherein remaining portions of the inner spacer layer form the inner spacers.

4. The method for forming a semiconductor device structure as claimed in claim 1, further comprising thermally annealing the second epitaxial structure to activate dopants in the second epitaxial structure after the semiconductor nanostructures are formed.

5. The method for forming a semiconductor device structure as claimed in claim 1, wherein edges of the semiconductor nanostructures adjacent to the second epitaxial structure are substantially aligned with edges of the first epitaxial structures adjacent to the second epitaxial structure.

6. The method for forming a semiconductor device structure as claimed in claim 1, wherein the second epitaxial structure is formed to have a first dopant concentration, each of the first epitaxial structures is formed to have a second dopant concentration, and the first dopant concentration is greater than the second dopant concentration.

7. The method for forming a semiconductor device structure as claimed in claim 1, wherein compositions and crystal orientations of the semiconductor nanostructures and the first epitaxial structures are substantially the same.

8. The method for forming a semiconductor device structure as claimed in claim 1, wherein each of the first epitaxial structures is formed to be in direct contact with at least one of the semiconductor nanostructures.

9. The method for forming a semiconductor device structure as claimed in claim 1, wherein the metal gate stack has an upper portion over a topmost surface of the semiconductor nanostructures, the upper portion of the metal gate stack has opposite sidewalls, and an interface between the metal gate stack and one of the inner spacers is laterally between the opposite sidewalls of the upper portion of the metal gate stack.

10. A method for forming a semiconductor device structure, comprising:

forming a fin structure over a semiconductor substrate, wherein the fin structure has a plurality of sacrificial layers and a plurality of semiconductor layers, and the sacrificial layers and the semiconductor layers are laid out alternately;

partially removing the fin structure to form a first recess;

partially removing the sacrificial layers exposed by the first recess to form a plurality of second recesses;

forming a plurality of inner spacers partially filling the second recesses and covering edges of the sacrificial layers, wherein the inner spacers are spaced apart from each other;

epitaxially growing semiconductor materials on the exposed surfaces of the semiconductor layers, wherein the semiconductor materials are merged to form an epitaxial layer extending along sidewalls and a bottom of the first recess;

partially removing the epitaxial layer, wherein remaining portions of the epitaxial layer form first epitaxial structures covering the inner spacers after the inner spacers are formed, wherein the first epitaxial structures are interleaved by the semiconductor layers;

forming a second epitaxial structure on the first epitaxial structures and edges of the semiconductor layers;

removing the sacrificial layers and partially removing the semiconductor layers to form a plurality of semiconductor nanostructures made of remaining portions of the semiconductor layers; and forming a metal gate stack wrapped around the semiconductor nanostructures.

11. The method for forming a semiconductor device structure as claimed in claim 10, wherein the second epitaxial structure is formed to have a first dopant concentration, each of the first epitaxial structures is formed to have a second dopant concentration, and the first dopant concentration is greater than the second dopant concentration.

12. The method for forming a semiconductor device structure as claimed in claim 11, wherein the second dopant concentration is substantially equal to zero.

13. The method for forming a semiconductor device structure as claimed in claim 10, wherein compositions and crystal orientations of the semiconductor nanostructures and the first epitaxial structures are substantially the same.

14. A method for forming a semiconductor device structure, comprising:

forming a plurality of semiconductor layers and a plurality of sacrificial layers laid out is an alternating manner on a substrate;

partially removing the semiconductor layers and the sacrificial layers to form a recess exposing side edges of the semiconductor layers and side edges of the sacrificial layers;

recessing the sacrificial layers from the side edges of the sacrificial layers;

forming inner spacers covering the side edges of the sacrificial layers;

partially removing the inner spacers such that the semiconductor layers protrude from outer edges of the inner spacers;

growing a plurality of first epitaxial structures on exposed portions of the semiconductor layers to cover the inner spacers, wherein the first epitaxial structures are spaced apart from each other by the semiconductor layers;

forming a second epitaxial structure covering the first epitaxial structures and the side edges of the semiconductor layers; and removing the sacrificial layers and partially removing the semiconductor layers to form a plurality of semiconductor nanostructures made of remaining portions of the semiconductor layers.

15. The method for forming a semiconductor device structure as claimed in claim 14, wherein the second epitaxial structure is formed to have a first dopant concentration, each of the first epitaxial structures is formed to have a second dopant concentration, and the first dopant concentration is greater than the second dopant concentration.

16. The method for forming a semiconductor device structure as claimed in claim 14, wherein compositions and crystal orientations of the semiconductor nanostructures and the first epitaxial structures are substantially the same.

17. The method for forming a semiconductor device structure as claimed in claim 14, wherein each of the first epitaxial structures is formed to be in direct contact with at least two of the semiconductor nanostructures and at least one of the inner spacers.

18. The method for forming a semiconductor device structure as claimed in claim 14, wherein the first epitaxial structures are formed to physically separate the inner spacers from the second epitaxial structure.

19. The method for forming a semiconductor device structure as claimed in claim 1, wherein the first epitaxial structures are spaced apart from each other by the semiconductor layers.

20. The method for forming a semiconductor device structure as claimed in claim 14, wherein the second epitaxial structure is grown on the side edges of the semiconductor layers and surfaces of the first epitaxial structures.

* * * * *